(12) United States Patent
Amari et al.

(10) Patent No.: US 12,507,513 B2
(45) Date of Patent: Dec. 23, 2025

(54) METHOD FOR MANUFACTURING LIGHT-EMITTING DEVICE, AND LIGHT-EMITTING DEVICE

(71) Applicant: NICHIA CORPORATION, Anan (JP)

(72) Inventors: Koichi Amari, Anan (JP); Yasunori Shimizu, Tokushima (JP); Hirofumi Ichikawa, Tokushima (JP); Hiroshi Iwata, Tokushima (JP)

(73) Assignee: NICHIA CORPORATION, Anan (JP)

( * ) Notice: Subject to any disclaimer, the term of this patent is extended or adjusted under 35 U.S.C. 154(b) by 375 days.

(21) Appl. No.: 18/352,200

(22) Filed: Jul. 13, 2023

(65) Prior Publication Data
US 2024/0021752 A1 Jan. 18, 2024

(30) Foreign Application Priority Data

Jul. 13, 2022 (JP) .................... 2022-112518

(51) Int. Cl.
*H10H 20/854* (2025.01)
*H10H 20/01* (2025.01)
(Continued)

(52) U.S. Cl.
CPC .......... *H10H 20/854* (2025.01); *H10H 20/01* (2025.01); *H10H 20/0362* (2025.01); *H10H 20/832* (2025.01); *H10H 20/857* (2025.01)

(58) Field of Classification Search
CPC .. H10H 20/01; H10H 20/016; H10H 20/0362; H10H 20/0364; H10H 20/83; H10H 20/832; H10H 20/852; H10H 20/853; H10H 20/854; H10H 20/857; H10H 29/0362; H10H 29/0364; H10H 29/49;
(Continued)

(56) References Cited

U.S. PATENT DOCUMENTS

| 6,331,446 B1 | 12/2001 | Cook et al. |
| 6,528,345 B1 | 3/2003 | Cook et al. |

(Continued)

FOREIGN PATENT DOCUMENTS

| JP | H05315396 A | 11/1993 |
| JP | H06188549 A | 7/1994 |

(Continued)

*Primary Examiner* — Cheung Lee
(74) *Attorney, Agent, or Firm* — Hunton Andrews Kurth LLP

(57) ABSTRACT

A method for manufacturing a light-emitting device includes providing a light-emitting element having element electrodes including a positive element electrode and a negative element electrode, a wiring substrate having wiring layers, and conductive members each electrically connecting one of the element electrodes and a corresponding one of the wiring layers, with at least one member of the element electrodes, the wiring layers, or the conductive members containing Au; arranging, between a lower surface of the light-emitting element and the wiring substrate, a resin composition in a liquid state; oxidizing a component B in the resin composition in contact with the at least one member containing Au; and after the oxidizing of the component B, heating and curing the resin composition not in contact with the at least one member containing Au.

12 Claims, 12 Drawing Sheets

(51) Int. Cl.
*H10H 20/832* (2025.01)
*H10H 20/857* (2025.01)

(58) Field of Classification Search
CPC .. H10H 29/832; H10H 29/852; H10H 29/853; H10H 29/854; H10H 29/922; H10H 29/942
See application file for complete search history.

(56) References Cited

U.S. PATENT DOCUMENTS

| | | | |
|---|---|---|---|
| 6,635,971 B2* | 10/2003 | Asada | H01L 24/29 257/788 |
| 6,913,945 B2 | 7/2005 | Yamauchi et al. | |
| 7,141,448 B2 | 11/2006 | Ramalingam et al. | |
| 8,710,651 B2 | 4/2014 | Sakata et al. | |
| 9,306,133 B2 | 4/2016 | Hamamoto et al. | |
| 2002/0014688 A1 | 2/2002 | Ramalingam et al. | |
| 2002/0017728 A1 | 2/2002 | Ramalingam et al. | |
| 2004/0047127 A1 | 3/2004 | Yamauchi et al. | |
| 2011/0084384 A1 | 4/2011 | Sakata et al. | |
| 2013/0056786 A1 | 3/2013 | Hamamoto et al. | |

FOREIGN PATENT DOCUMENTS

| | | |
|---|---|---|
| JP | H08195414 A | 7/1996 |
| JP | H09172110 A | 6/1997 |
| JP | H11251343 A | 9/1999 |
| JP | 2000315704 A | 11/2000 |
| JP | 2001291805 A | 10/2001 |
| JP | 2002203874 A | 7/2002 |
| JP | 2002538624 A | 11/2002 |
| JP | 2002538625 A | 11/2002 |
| JP | 2002538626 A | 11/2002 |
| JP | 2003261770 A | 9/2003 |
| JP | 2003268239 A | 9/2003 |
| JP | 2006073677 A | 3/2006 |
| JP | 2009117427 A | 5/2009 |
| JP | 2010050361 A | 3/2010 |
| JP | 2011009346 A | 1/2011 |
| JP | 2011086705 A | 4/2011 |
| JP | 2012089727 A | 5/2012 |
| JP | 2013055205 A | 3/2013 |
| JP | 2014220475 A | 11/2014 |
| JP | 2015097276 A | 5/2015 |
| JP | 2017147371 A | 8/2017 |

* cited by examiner

100A

METHOD FOR MANUFACTURING LIGHT-EMITTING DEVICE, AND LIGHT-EMITTING DEVICE

CROSS-REFERENCE TO RELATED APPLICATION

This application claims priority to Japanese Patent Application No. 2022-112518 filed on Jul. 13, 2022, the disclosures of which are hereby incorporated by reference in their entireties.

BACKGROUND

The present disclosure relates to a method for manufacturing a light-emitting device and to a light-emitting device.

In a light-emitting device having a light-emitting element arranged on a wiring substrate via a conductive member, a known method for ensuring bonding strength between the wiring substrate and the light-emitting element is filling the space between the wiring substrate and the light-emitting element with an underfill. (For example, see JP 2002-203874 A)

CITATION LIST

Patent Literature

Patent Document 1: JP 2002-203874 A

SUMMARY

However, room for improving the bonding reliability between the light-emitting element and the wiring substrate exists. Thus, an object of one aspect of the present disclosure is to provide a method for manufacturing a light-emitting device having high bonding reliability between a light-emitting element and a wiring substrate, and to provide a light-emitting device.

A method for manufacturing a light-emitting device according to an aspect of the present disclosure comprises:
providing
  a light-emitting element having element electrodes including a positive element electrode and a negative element electrode on a lower surface side of the light-emitting element,
  a wiring substrate having wiring layers, and
  conductive members each electrically connecting one of the element electrodes and a corresponding one of the wiring layers,
    with at least one member of the element electrodes, the wiring layers, or the conductive members containing Au;
arranging, between a lower surface of the light-emitting element and the wiring substrate, a resin composition in a liquid state comprising
  (component A) a siloxane compound having at least two alkenyl groups in one molecule,
  (component B) a siloxane compound having a SiH group at both terminals in one molecule and having no SiH group in a side chain, and (component C) a hydrosilylation reaction catalyst;
oxidizing the component B in the resin composition in contact with the at least one member containing Au of the element electrodes, the wiring layers, or the conductive members to form a first portion of a resin member; and
after the oxidizing of the component B, heating and curing the resin composition not in contact with the at least one member containing Au of the element electrodes, the wiring layers, or the conductive members to form a second portion of the resin member.

A light-emitting device according to an aspect of the present disclosure includes:
  a wiring substrate including a base material and wiring layers;
  a light-emitting element arranged on the wiring substrate and having element electrodes including a positive element electrode and a negative element electrode on a lower surface side of the light-emitting element;
  conductive members each electrically connecting one of the wiring layers and a corresponding one of the element electrodes; and
  a resin member having
    a first portion in contact with the wiring layers, the conductive members, and the element electrodes, the first portion being in a liquid state, and
    a second portion surrounding the first portion, the second portion being in a cured state.

Advantageous Effects of Invention

According to one aspect of the present disclosure, a method for manufacturing a light-emitting device having high bonding reliability between a light-emitting element and a wiring substrate, and a light-emitting device can be provided.

DESCRIPTION OF EMBODIMENTS

Figure 1:
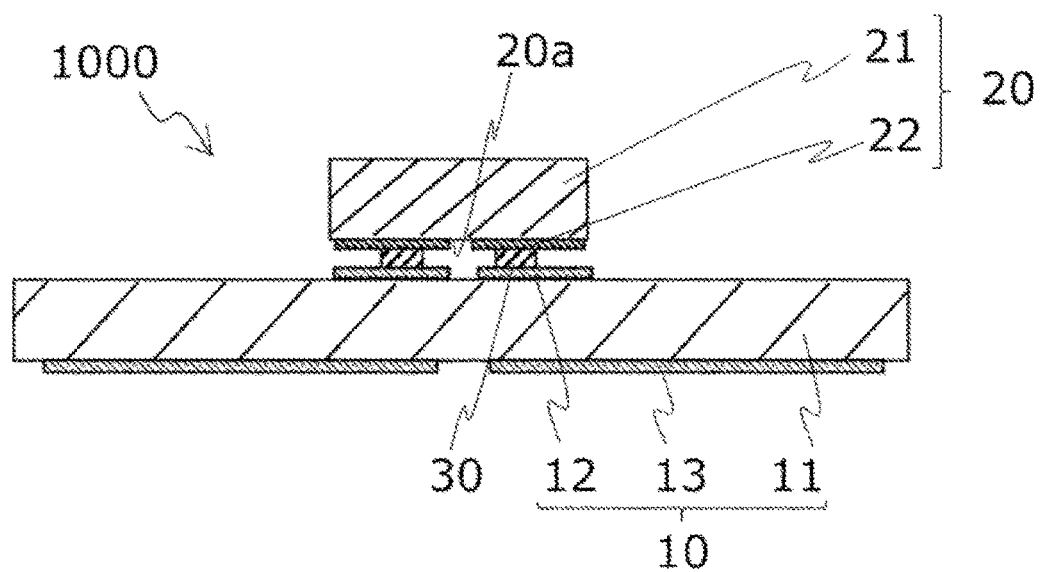
FIG. 1 is a schematic cross-sectional view (part 1) illustrating one state in a step for manufacturing a light-emitting device according to a first embodiment.

A method for manufacturing a light-emitting device according to an embodiment of the present disclosure, and the light-emitting device thereof are described below on the basis of the drawings. In the following description, terms indicating a specific direction or position are used as necessary. However, these terms are used to facilitate an understanding of the invention with reference to the drawings, and the technical scope of the present invention is not limited by the meanings of these terms. Parts having the same reference characters appearing in the plurality of drawings indicate identical or equivalent parts.

The following embodiments exemplify the method for manufacturing a light-emitting device, and the light-emitting device in order to embody the technical concept of the present invention, but the present invention is not limited to the embodiments below. The dimensions, materials, shapes, relative arrangements, and the like of constituent elements described below are not intended to limit the scope of the present invention to those alone, but are intended to provide an example, unless otherwise specified. The size, positional relationship, and the like of the members illustrated in the drawings may be exaggerated in order to clarify the explanation. The contents described in one embodiment can be applied to other embodiments and other examples. Furthermore, in order to avoid excessive complication of the drawings, a schematic view in which some elements are not illustrated may be used, or an end view illustrating only a cutting surface may be used as a cross-sectional view.

First Embodiment

Method for Manufacturing Light-Emitting Device

A method for manufacturing a light-emitting device according to a first embodiment is described below with reference to the drawings. FIGS. 1 to 4 are schematic cross-sectional views, each illustrating one state of the method for manufacturing the light-emitting device according to the first embodiment.

Step of Preparing Intermediate

As illustrated in FIG. 1, an intermediate 1000 is prepared. The intermediate 1000 includes: a light-emitting element 20 having positive and negative element electrodes 22 on a lower surface 20a side; a wiring substrate 10 having wiring layers 12; and conductive members 30 that each electrically connecting an element electrode of the positive and negative element electrodes 22 and the corresponding wiring layer of wiring layers 12.

The intermediate 1000 is formed by, for example, arranging each of the conductive members 30 on the corresponding wiring layer of the wiring layers 12 of the wiring substrate 10 and then flip-chip mounting the light-emitting element 20. At this time point, a space that connects to the outside and in which a later-described resin composition 40a can be arranged is present between the lower surface 20a of the light-emitting element 20 and the wiring substrate 10. However, the intermediate 1000 is not limited thereto and may be formed by arranging each of the conductive members 30 on the corresponding element electrode of the positive and negative element electrodes 22 of the light-emitting element 20 and then flip-chip mounting, on the wiring substrate 10, the light-emitting element 20 provided with the conductive members 30.

The intermediate 1000 may be prepared by forming in a manner as described above or may be prepared by being purchased.

In the intermediate 1000, at least one among the element electrodes 22, the wiring layers 12, and the conductive members 30 contains Au. In the present embodiment, the element electrodes 22, the wiring layers 12, and the conductive members 30 all contain Au. The Au contained in the element electrodes 22, the wiring layers 12, and the conductive members 30 is only required to be contained in the surfaces of the element electrodes 22, the wiring layers 12, and the conductive members 30 that are in contact with the later-described resin composition 40a. For example, a plating layer located on the surfaces of the element electrodes 22, the wiring layers 12, and the conductive members 30 may contain Au.

Step of Arranging Resin Composition

Figure 2:
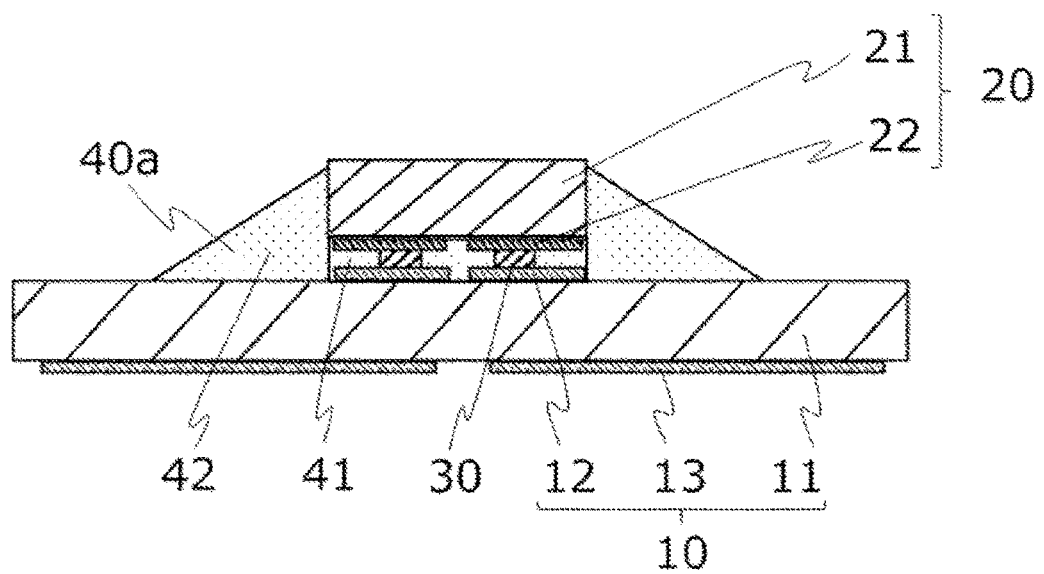
FIG. 2 is a schematic cross-sectional view (part 2) illustrating one state in a step for manufacturing the light-emitting device according to the first embodiment.

As illustrated in FIG. 2, the resin composition 40a is arranged between the lower surface 20a of the light-emitting element 20 and the wiring substrate 10. In the example illustrated in FIG. 2, the resin composition 40a also surrounds the light-emitting element 20. The resin composition 40a is arranged so as to have, in a top view, a portion (a first portion 41 illustrated in FIG. 2) overlapping the light-emitting element 20 and a portion (a second portion 42 illustrated in FIG. 2) surrounding the first portion 41.

The resin composition 40a is in a liquid state and is heat-curable. The resin composition 40a contains the following components A, B and C. (Component A) A siloxane compound having at least two alkenyl groups each bonded to a silicon atom in one molecule.

(Component B) A siloxane compound having a SiH group at both terminals in one molecule and having no SiH group in a side chain. (Component C) A hydrosilylation reaction catalyst.

The component A is a siloxane compound represented by the following general formula (1).

[Chem. 1]

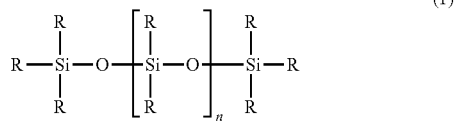

In Formula (1), each R is independent, and at least two represent alkenyl groups (for example, a vinyl group). The remaining R are methyl or phenyl groups. Further, n is an integer in a range from 10 to 10000.

The component A is a main component of the resin composition 40a. The component A has an alkenyl group, which is a functional group that can participate in a hydrosilylation reaction. The component A is a siloxane compound having a siloxane bond in the main chain and having at least two alkenyl groups each bonded to a silicon atom in one molecule.

The molecular structure of the component A is linear in formula (1). However, the molecular structure of the component A is not limited thereto, and may be a branched structure, a cyclic structure, or a structure that is a combination thereof. Two or more types of the component A can be used in combination, and for example, a linear component A and a branched component A can be used in combination.

A bonding position of each of the alkenyl groups is not limited as long as at least two alkenyl groups are present in one molecule. For example, each of the alkenyl groups may be bonded to the terminal end or a side chain, or the alkenyl groups may be bonded to both a terminal end and a side chain or side chains, in one molecule.

Examples of the alkenyl group include a vinyl group, an allyl group, a propenyl group, and a butenyl group, and a vinyl group is particularly preferable because a hydrosilylation reaction is easily carried out.

The component B is a siloxane compound represented by the following general formula (2).

[Chem. 2]

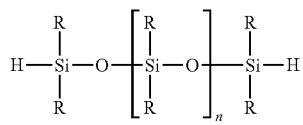
(2)

In the formula (2), each R is independently a methyl group or a phenyl group. Further, n is in a range from 1 to 2000.

The component B serves as a crosslinking agent. The component B is a siloxane compound having a SiH group, which is a functional group that can react with an alkenyl group. Specifically, the component B is a siloxane compound having a SiH group at both terminals and having no SiH group in a side chain. An example of the component B is a siloxane compound having a SiH group at both terminals, having a methyl group in some side chains, and having a phenyl group in the remaining side chains. As indicated in formula (2), the component B is an open chain compound. The open chain compound may be linear or branched.

Component C The component C is a hydrosilylation reaction catalyst for promoting a hydrosilylation reaction between the component A and the component B. The component C is, for example, a compound containing a platinum group metal of platinum, rhodium, or palladium.

The temperature at which the resin composition 40a is arranged is less than the temperature at which thermosetting of the resin composition 40a begins. The temperature at which the resin composition 40a is arranged may be room temperature or a temperature in a range from higher than room temperature to 50° C. In the present specification, room temperature means any temperature in a range from 10° C. to 30° C. When the temperature is the range from higher than room temperature to 50° C., thermosetting of the resin composition 40a is suppressed, and the resin composition 40a easily flows between the light-emitting element 20 and the wiring substrate 10 when the resin composition 40a is arranged thereon by coating. In addition, if the temperature is room temperature, curing of the resin composition 40a can be reliably suppressed in arranging the resin composition 40a.

A known method can be used as the method of arranging the resin composition 40a. For example, a dripping method or a jet dispensing method can be used.

Oxidation Step

Figure 3:
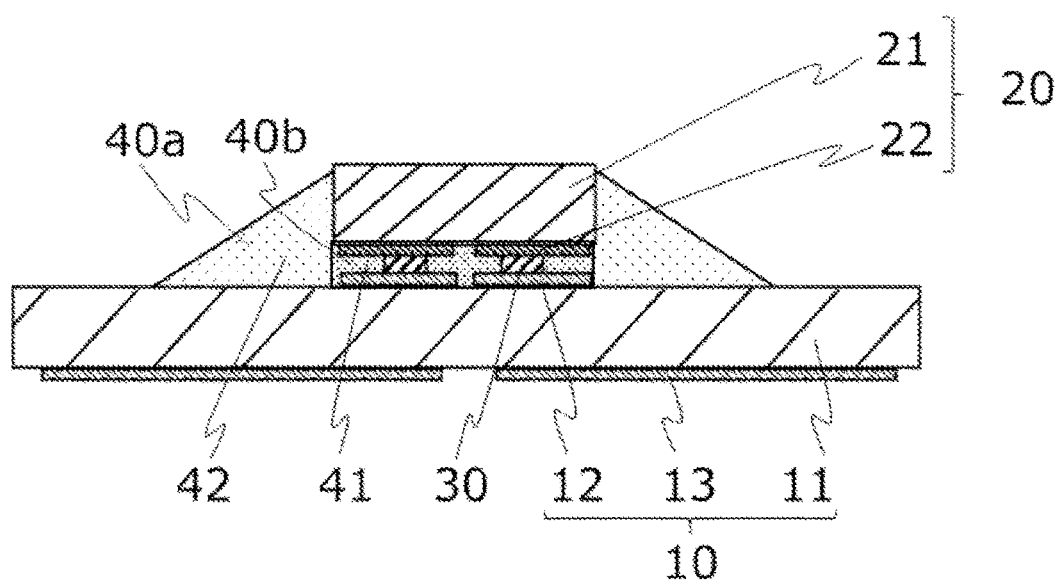
FIG. 3 is a schematic cross-sectional view (part 3) illustrating one state in a step for manufacturing the light-emitting device according to the first embodiment.

Subsequently, as illustrated in FIG. 3, the component B in the resin composition 40a in contact with the at least one member containing Au of the element electrodes 22, the wiring layers 12, or the conductive members 30 is oxidized.

The component B in the resin composition 40a in contact with the Au-containing member among the element electrodes 22, the wiring layers 12, and the conductive members 30 causes an oxidation reaction expressed by the following chemical equation (3).

[Chem. 3]

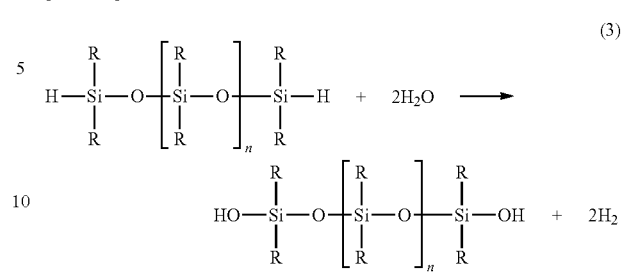
(3)

In chemical equation (3), each R is independently a methyl group or a phenyl group. n is an integer in a range from 1 to 2000.

It is conceivable that this oxidation reaction is caused by a reaction of the component B with moisture ($H_2O$) contained in the air and/or the resin composition 40a. In addition, it is conceivable that this oxidation reaction is promoted by the Au serving as an oxidation catalyst, the Au being contained in at least one member among the element electrodes 22, the wiring layers 12, and the conductive members 30.

A component B' is produced through this oxidation reaction. The component B' is a siloxane compound having no SiH group. In the example presented in chemical equation (3), the component B' is a siloxane compound having a SiOH group at both terminals in one molecule and having a methyl group or a phenyl group in a side chain. Therefore, after the oxidation reaction, the resin composition in contact with the Au-containing member among the element electrodes 22, the wiring layers 12, and the conductive members 30 becomes a resin composition 40b containing the components A, B', and C.

In the present embodiment, the element electrodes 22, the wiring layers 12, and the conductive members 30 all contain Au. By shortening the distance between the element electrodes 22, the distance between the wiring layers 12, and the distance between each of the element electrodes 22 and the corresponding wiring layer of the wiring layers 12, in the first portion, the resin composition easily undergoes an oxidation reaction in a region in contact with the element electrodes 22, the wiring layers 12, and the conductive members and in the interior thereof. Therefore, as illustrated by the example in FIG. 3, the component B contained in the first portion 41 can be oxidized. In the example of FIG. 3, the first portion 41 is the resin composition 40b. The resin composition 40b is in a liquid state.

On the other hand, the component B in the resin composition not in contact with the Au-containing member among the element electrodes 22, the wiring layers 12, and the conductive members 30 is not easily oxidized. In the example of FIG. 3, the second portion 42 is a resin composition not in contact with a Au-containing member among the element electrodes 22, the wiring layers 12, and the conductive members 30, and therefore the component B in the resin composition of the second portion 42 is not easily oxidized. Accordingly, the second portion 42 is the resin composition 40a containing the components A, B, and C. The resin composition 40a is in a liquid state.

In the oxidation step, the temperature is maintained for a predetermined amount of time at a temperature lower than the temperature at which thermosetting of the resin composition 40a begins. The "predetermined amount of time" means the time until the oxidation reaction is completed (that is, the time until the SiH groups of the component B are replaced by SiOH groups). The completion of the oxidation reaction can be confirmed by visually confirming that the resin composition in contact with the Au-containing member among the element electrodes 22, the wiring layers 12, and the conductive members 30 is not cured in the curing step described below. In the oxidation step, the amount of time for which the resin composition 40a is maintained at the predetermined temperature is, for example, 30 minutes or longer.

Similar to the temperature at which the resin composition 40a is arranged, the temperature at which the component B of the resin composition 40a is oxidized may be room temperature, or may be a temperature in a range from higher than room temperature to 50° C. The temperature at which the component B of the resin composition 40a is oxidized can be the same as the temperature when the resin composition 40a is arranged.

When the temperature at which the component B of the resin composition 40a is oxidized is maintained for a predetermined amount of time, the temperature thereof may be constant or may be varied within a range equal to or lower than the temperature at which thermosetting of the resin composition 40a does not begin.

Curing Step

Figure 4:
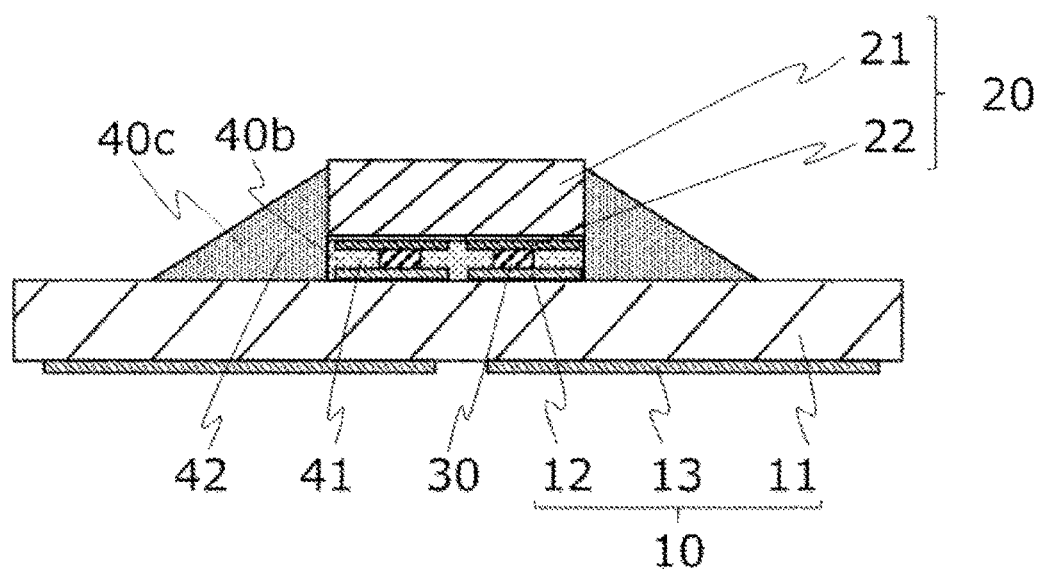
FIG. 4 is a schematic cross-sectional view (part 4) illustrating one state in a step for manufacturing the light-emitting device according to the first embodiment.

After the oxidation step, resin compositions 40b and 40c are heated as illustrated in FIG. 4. Through this heating, the resin composition 40c is cured. The resin composition is the resin composition not in contact with any member containing Au among the element electrodes 22, the wiring layers 12, and the conductive members 30.

The component A in the resin composition not in contact with any member containing Au among the element electrodes 22, the wiring layers 12, and the conductive members 30 causes a hydrosilylation reaction with the component B as indicated the chemical equation (4). In this reaction, the component C functions as a catalyst. In the chemical equation (4), a compound having a vinyl group at a terminal and in a side chain is given as an example of the component A.

[Chem. 4]

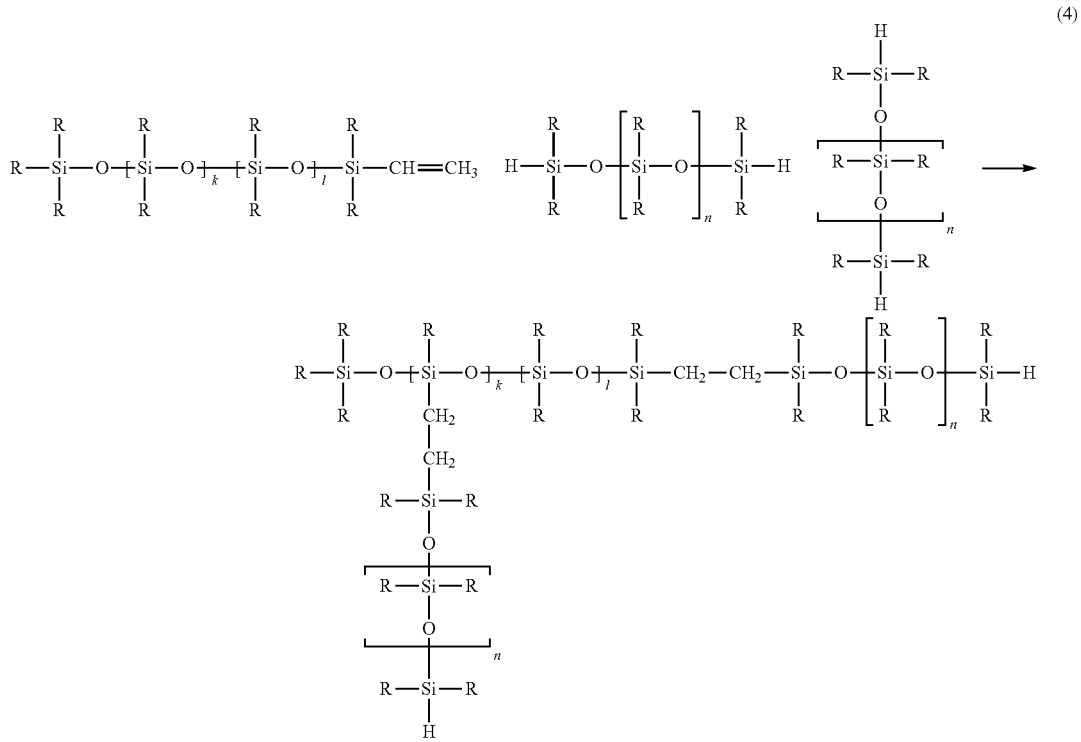

(4)

In chemical equation (4), each R is independently a methyl group or a phenyl group. Furthermore, k+l is an integer in a range from 10 to 10000. n is an integer in a range from 1 to 2000.

Through this reaction, a siloxane compound (component D) having a silethylene structure is produced. Accordingly, the resin composition not in contact with a Au-containing member among the element electrodes 22, the wiring layers 12, and the conductive members 30 becomes the resin composition 40c containing the component D. The component D produced according to the above-described chemical equation (4) has a SiH group at a terminal. This SiH group can cause another hydrosilylation reaction with the component A. The resin composition 40c is cured through the hydrosilylation reaction.

In the present embodiment, as illustrated in the example of FIG. 4, the second portion 42 is the resin composition 40c.

On the other hand, the resin composition in contact with the member containing Au among the element electrodes 22, the wiring layers 12, and the conductive members 30 is not cured even when heated, and is maintained in a liquid state. It is conceivable that this is because after the oxidation reaction, the resin composition 40b does not contain a siloxane compound (component B) having a SiH group, and therefore a hydrosilylation reaction does not occur.

In this manner, a light-emitting device 100A according to the first embodiment can be produced.

Light-Emitting Device

Figure 5A:
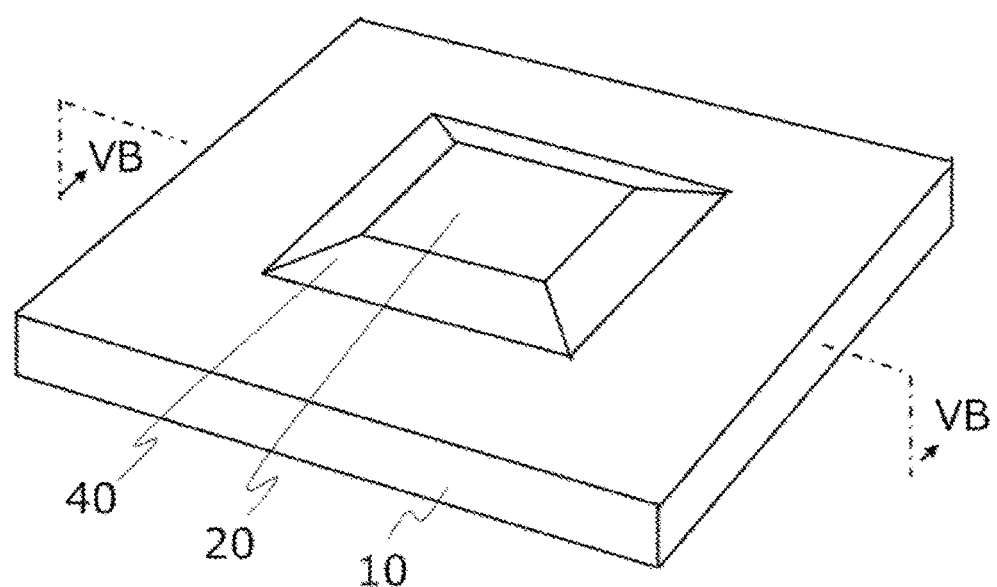
FIG. 5A is a schematic perspective view illustrating the light-emitting device according to the first embodiment.
Figure 5B:
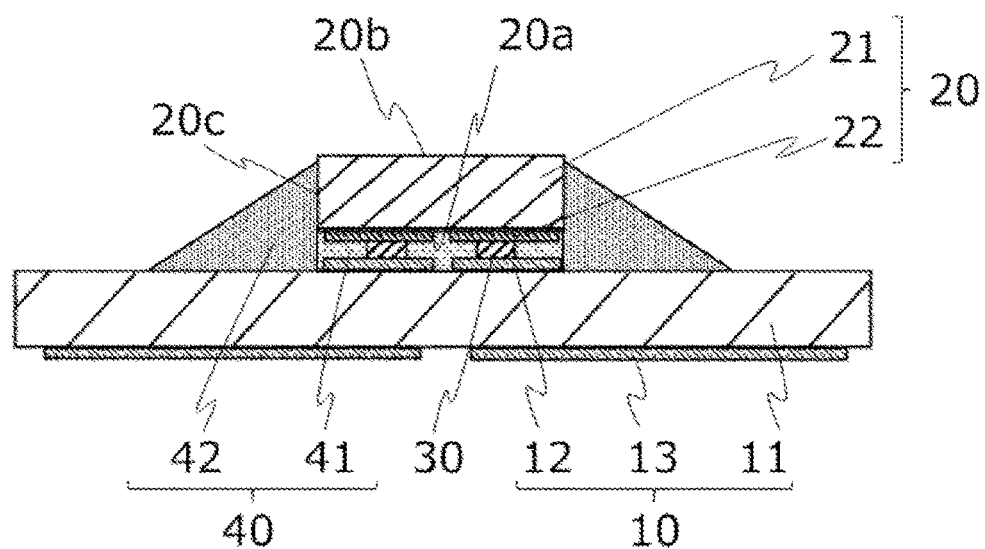
FIG. 5B is a schematic cross-sectional view along line VB-VB of FIG. 5A.

The light-emitting device produced by the above-described manufacturing method of the first embodiment has the following configuration. FIG. 5A is a schematic perspective view illustrating a light-emitting device according to the first embodiment. FIG. 5B is a schematic cross-sectional view along line VB-VB of FIG. 5A.

The light-emitting device 100A according to the first embodiment includes:

a wiring substrate 10 including a base material 11 and wiring layers 12;

a light-emitting element 20 arranged on the wiring substrate 10 and having positive and negative element electrodes 22 on a lower surface 20a side of the light-emitting element 20;

conductive members 30 each electrically connecting a wiring layer of the wiring layers 12 and the corresponding element electrode of the positive and negative element electrodes 22; and a resin member 40 having a first portion 41 in contact with the wiring layers 12, the conductive members 30, and the positive and negative element electrodes 22, the first portion 41 being in a liquid state, and a second portion 42 surrounding the first portion 41, the second portion 42 being in a cured state.

In the light-emitting device 100A, the first portion 41 of the resin member 40 is in a liquid state, and therefore even if the resin member 40 thermally expands when the light-emitting device 100A is mounted on a mounting substrate through solder reflow for example, pushing up of the light-emitting element 20 by the first portion 41 of the resin member 40 can be reduced. As a result, peeling of the light-emitting element 20 from the wiring substrate 10 can be reduced.

Components of the light-emitting device 100A will be described below.

Wiring Substrate 10

The wiring substrate 10 is used to support members configuring the light-emitting device 100A. As the wiring substrate 10, as illustrated in FIG. 5B, the wiring layers 12 for electrically connecting with the element electrodes 22 of the light-emitting element 20 are arranged on an upper surface of the base material 11. In the example of FIGS. 5A and 5B, external connection electrodes 13 for electrically connecting an external power supply and the light-emitting device 100A are provided on the lower surface of the base material 11. However, the external connection electrodes 13 are not limited to being provided on the lower surface of the base material 11, and can be provided on the upper surface of the base material 11. The wiring substrate 10 includes via wiring and the like that electrically connect the wiring layers 12 and the external connection electrodes 13. An insulating material that does not easily allow the transmission of light from the light-emitting element 20 or outside light is preferably used as the material of the base material 11, and examples of such insulating material includes inorganic materials such as aluminum oxide, aluminum nitride, or a low temperature co-fired ceramic (LTCC), and resin materials such as phenolic resin, epoxy resin, polyimide resin, bismaleimide-triazine (BT) resin, or polyphthalamide. In addition, a composite material of an insulating material and a metal member can also be used. In a case in which a resin is used as the material of the base material of the wiring substrate, as necessary, an inorganic filler such as glass fibers, silicon oxide, titanium oxide, and aluminum oxide may be mixed into the resin. As a result, the mechanical strength can be improved, the thermal expansion coefficient can be reduced, and the light reflectance can be improved. Note that no specific limitation is applied to the thickness of the substrate, and the thickness of the substrate can be set to any thickness according to the purpose and application.

The wiring layer 12 is, for example, a laminate in which a Cu layer, a Ni layer, and a Au layer are laminated in this order from the base material 11 side. Each layer can be formed using plating, for example. The wiring layers 12 are arranged below the light-emitting element 20. In a plan view, the wiring layers 12 may be arranged further inward than an outer edge of the light-emitting element 20, or may be extended further outward than the outer edge of the light-emitting element 20. In the example illustrated in FIG. 5B, in plan view, the wiring layers 12 are arranged further inward than the outer edge of the light-emitting element 20 and are not extended outward of the outer edge of the light-emitting element 20. Therefore, in the curing step, the second portion 42 is cured while the first portion 41 of the resin member 40 remains in a liquid state.

Light-Emitting Element 20

The light-emitting element 20 has, for example, a rectangular parallelepiped shape. The light-emitting element has a lower surface 20a positioned on the wiring substrate 10 side, an upper surface 20b positioned at the side opposite the lower surface 20a, and four side surfaces 20c located between the lower surface 20a and the upper surface 20b. The light-emitting element 20 includes a semiconductor structure 21 and element electrodes 22 electrically connected to the semiconductor structure 21. The light-emitting element 20 includes positive and negative element electrodes 22 on a lower surface side of the light-emitting element 20.

The semiconductor structure 21 includes an n-side semiconductor layer, a p-side semiconductor layer, and an active layer interposed between the n-side semiconductor layer and the p-side semiconductor layer. The active layer may have a single quantum well (SQW) structure, or may have a multi quantum well (MQW) structure including a plurality of well layers. The semiconductor structure 21 includes a plurality of semiconductor layers made of a nitride semiconductor. The nitride semiconductor includes a semiconductor having all compositions in which in a chemical formula of $In_xAl_yGa_{1-x-y}N$ ($0 \leq x$, $0 \leq y$, and $x+y \leq 1$), composition ratios x and y are changed within respective ranges. The light emission peak wavelength of the active layer can be selected as appropriate according to the purpose. The active layer is configured, for example, so as to be able to emit visible light or ultraviolet light.

The semiconductor structure 21 may include a plurality of light-emitting members each including an n-side semiconductor layer, an active layer, and a p-side semiconductor layer. In a case in which the semiconductor structure includes a plurality of light emitting portions, the plurality of light emitting portions may include well layers having different peak wavelengths of emitted light or may include well layers having the same peak wavelength of emitted light. Note that the "same peak wavelength of emitted light" includes a case in which there is a variation of not more than 5 nm. The combination of the light emission peak wavelengths of the plurality of light-emitting portions can be selected as appropriate. For example, in a case in which the semiconductor structure includes two light emitting portions, the combinations of light emitted from each of the two light emitting portions include a combination of blue light and blue light, a combination of green light and green light, a combination of red light and red light, a combination of ultraviolet light and ultraviolet light, a combination of blue light and green light, a combination of blue light and red light, or a combination of green light and red light.

For example, when the semiconductor structure 21 includes three light-emitting portions, combinations of light emitted from the respective light-emitting portions include a combination of blue light, green light, and red light. Each of the light-emitting portions may include one or more well layers having light emission peak wavelengths different from the light emission peak wavelengths of other well layers.

Each element electrode 22 is a laminate in which, for example, a Ti layer, a Pt layer, and a Au layer are laminated in order from the semiconductor structure 21 side. Each layer can be formed using plating.

From an upper surface view, the size of the light-emitting element 20 is, for example, 1 mm×1 mm. When the element electrodes 22, the wiring layers 12, and the conductive members 30 contain Au, the thickness from the lower surface 20a to the upper surface 20b of the light-emitting element 20 is, for example, 110 µm.

Conductive Member 30

Each conductive member 30 is a member for electrically connecting an element electrode 22 of the light-emitting element 20 with a wiring layer 12 of the wiring substrate 10.

Au or a Au alloy, for example, can be used as the material of the conductive member 30. Examples of the shape of the conductive member 30 include a spherical shape, a hemispherical shape, a cylindrical shape, a prismatic shape, a truncated cone shape, and a truncated pyramid shape. A solder material such as Sn—Cu, Sn—Ag—Cu, and Au—Sn can be used.

The thickness of the conductive member 30 is preferably in a range from 1 µm to 10 µm, for example. The first portion 41 can be maintained in a liquid state by not excessively increasing the thickness of the first portion 41. The thickness of the conductive member 30 can be set to 8 µm, for example.

Preferably, the wiring layers 12, the element electrodes 22, and the conductive members all contain Au. Through such a configuration, since the members containing Au can be connected to each other, bonding between the wiring layer 12 and the conductive member 30 and bonding between the element electrode 22 and the conductive member can be improved. Furthermore, when the wiring layers 12, the element electrodes 22, and the conductive members 30 all contain Au, the surface area of the resin member 40 in contact with members containing Au is increased compared to a case in which, among the wiring layers 12, the element electrodes 22, and the conductive members 30, any but not all members contains Au. Therefore, the region that is not cured after heating, that is, the liquid portion, can be increased. Through this, when the resin member 40 is thermally expanded, pushing up of the light-emitting element 20 by the first portion 41 of the resin member 40 can be reduced.

Resin Member 40

The resin member 40 is used to increase the bonding strength between the light-emitting element 20 and the wiring substrate 10. The resin member 40 is arranged on the wiring substrate 10. The resin member 40 includes a liquid first portion 41 that is in contact with the wiring layers 12, the conductive members 30, and the element electrodes 22, and a cured second portion 42 that surrounds the first portion 41.

The first portion 41 is constituted of the above-described resin composition 40b. That is, the first portion 41 includes a siloxane compound having no SiH group. As an example, the first portion 41 includes a siloxane compound having a SiOH group at both terminals in one molecule and having a methyl group or a phenyl group in a side chain. The second portion 42 is constituted of the above-described resin composition 40c. That is, the second portion includes a siloxane compound having a silethylene structure.

In the example illustrated in FIG. 5B, the resin member 40 of the second portion 42 is in contact with the four side surfaces 20c of the light-emitting element 20. Through such a configuration, outward flow of the resin member 40 of the first portion 41 to outside of the second portion 42 can be suppressed.

With regard to each side surface 20c of the light-emitting element 20, the resin member 40 of the second portion 42 may be in contact with the entire side surface 20c or may be in contact with a portion of the side surface 20c.

The resin member 40 may contain a light-reflecting material (for example, titanium oxide). Through this, light traveling from the light-emitting element 20 to the wiring substrate 10 side can be reflected by the resin member 40, and thus the light extraction efficiency is improved. In relation to the resin contained in the resin member 40, the content of the light-reflecting material is, for example, in a range from 30 per hundred resin (phr) to 100 phr.

When the resin member 40 contains a light-reflecting material, the upper end of the second portion 42 is preferably located at the same position as the upper surface 20b of the light-emitting element 20 or at a position lower than the upper surface 20b of the light-emitting element 20. Through such a configuration, light emitted from the upper surface 20b of the light-emitting element 20 is not blocked by the second portion 42, and therefore light emitted from the light-emitting device 100A can be widely distributed.

In the example illustrated in FIG. 5B, the upper surface of the second portion 42 of the resin member 40 is an inclined surface for which the height decreases with increasing distance from the light-emitting element 20. In a cross-sectional view, this inclined surface may be linear, may be curved so as to be recessed toward the wiring substrate 10 side, or may be curved so as to bulge toward a side opposite the wiring substrate 10 side.

Second Embodiment

Figure 6A:
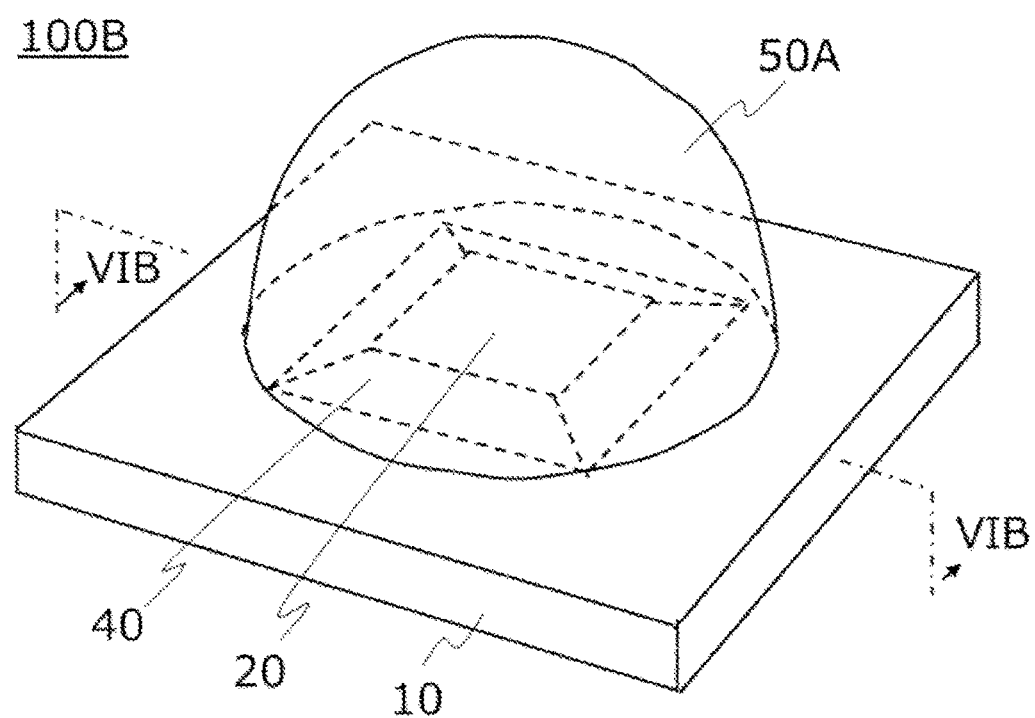
FIG. 6A is a schematic perspective view illustrating a light-emitting device according to a second embodiment.
Figure 6B:
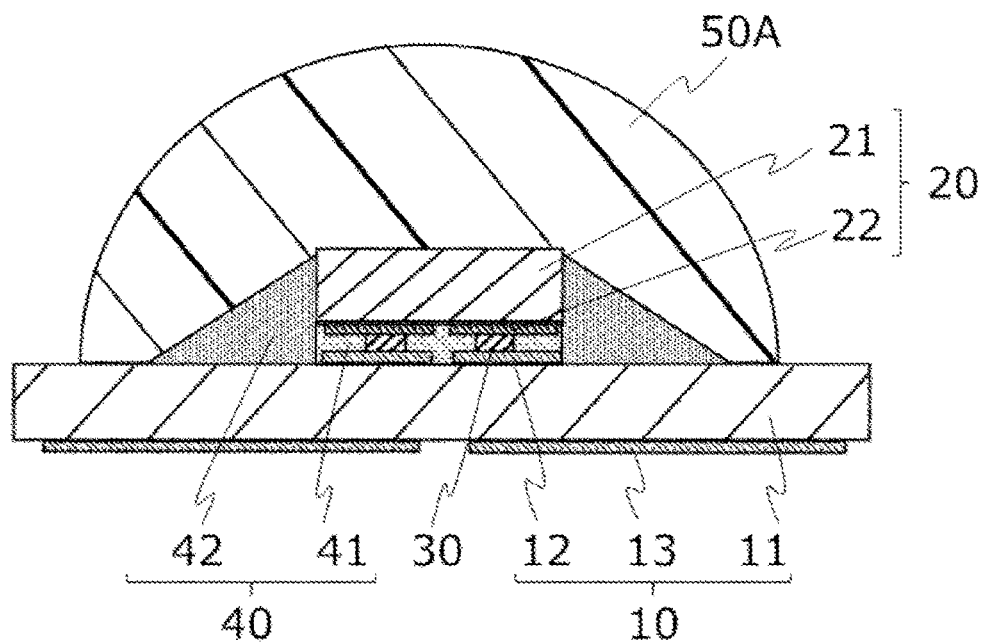
FIG. 6B is a schematic cross-sectional view along line VIB-VIB of FIG. 6A.

As illustrated in FIGS. 6A and 6B, the light-emitting device may be configured as a light-emitting device 100B by arranging a light-transmissive sealing member 50A on the upper surface of the second portion 42 of the resin member 40. FIG. 6A is a schematic perspective view illustrating a light-emitting device according to a second embodiment. FIG. 6B is a schematic cross-sectional view along line VIB-VIB of FIG. 6A. The same reference characters are assigned to those members already described above, and explanations thereof are omitted as appropriate. The same applies to the embodiments described below as well.

The first portion 41 of the resin member 40 is in a liquid state, and therefore the light-emitting device 100B can achieve the same effect as the light-emitting device 100A. Furthermore, even when the resin member 40 thermally expands, pushing up of the light-emitting element 20 by the first portion 41 of the resin member 40 can be reduced, and therefore deformation of the sealing member 50A can be reduced. As a result, desired light distribution characteristics can be provided with the light-emitting device 100B.

Sealing Member 50A

The sealing member 50A is used to protect the light-emitting element 20 and the resin member 40 from the external environment. In the example illustrated in FIG. 6B, the sealing member 50A is arranged on the upper surfaces of the light-emitting element 20 and the second portion 42 of the resin member 40. The sealing member 50A is formed in a hemispherical shape. The sealing member 50A is arranged such that a center axis of the sealing member 50A is aligned with a center axis of the light-emitting element 20.

Examples of the material of the sealing member 50A include glass and light-transmissive resins exhibiting excellent weather resistance, such as polycarbonate resin, acrylic resin, epoxy resin, urea resin, and silicone resin. The material of the sealing member 50A may be the same as or different from the material of the resin member 40. The sealing member 50A may contain a filler such as a diffusing material. Changes in light distribution can be reduced by a filler contained in the sealing member 50A.

Examples of the filler include barium titanate, titanium oxide, aluminum oxide, and silicon oxide. The sealing member 50A may optionally contain or not contain a phosphor. A known phosphor material can be used as the phosphor.

The method for manufacturing the light-emitting device 100B includes, after the above-described curing step, a step of arranging the sealing member 50A on the upper surface of the resin composition 40c. The second portion 42 of the resin member 40 is in a solid state, and thus mixing of the sealing member 50A with the resin member 40 can be reduced when the sealing member 50 is arranged thereon.

In the example illustrated in FIG. 6B, the sealing member 50A is arranged on the upper surface of the resin composition 40c (the second portion 42), on the upper surface 20b of the light-emitting element 20, and on the upper surface of the wiring substrate 10. A known method is used as the method for arranging the sealing member 50A thereon. For example, when the sealing member 50A is a resin, the sealing member can be formed by compression-molding. After the compression molding, the sealing member can be cured by heating in an oven at 150° C. for 4 hours, for example.

Modified Example (1) of Second Embodiment

Figure 7:
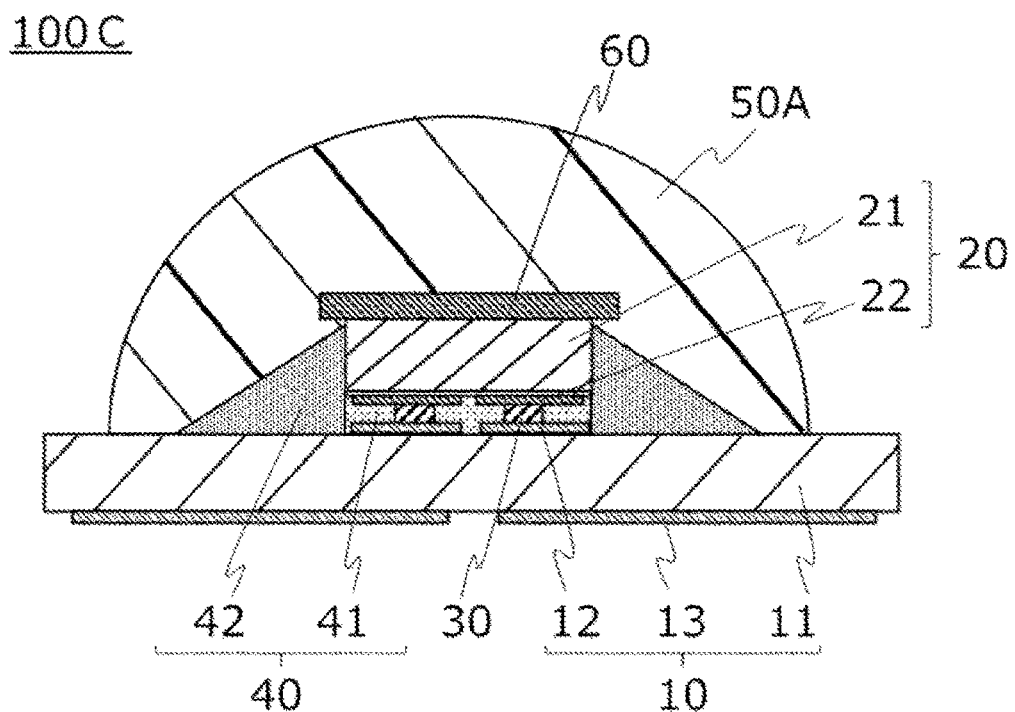
FIG. 7 is a schematic cross-sectional view illustrating a modified example (1) of the light-emitting device according to the second embodiment.

FIG. 7 is a schematic cross-sectional view illustrating a modified example (1) of the second embodiment. As illustrated in the example of FIG. 7, the light-emitting device 100 may be a light-emitting device 100C in which a light-transmissive member 60 is arranged on the upper surface 20b of the light-emitting element 20, and the sealing member 50A is arranged thereon so as to cover the light-transmissive member.

The first portion 41 of the resin member 40 is in a liquid state, and therefore the light-emitting device 100C can achieve the same effect as the light-emitting device 100A. Furthermore, even when the resin member 40 thermally expands, pushing up of the light-emitting element 20 by the first portion 41 of the resin member 40 can be reduced, and therefore deformation of the sealing member 50A can be reduced. As a result, desired light distribution characteristics can be provided with the light-emitting device 100C.

A resin, a glass, or a ceramic may be used, for example, as the material of the light-transmissive member 60. The light-transmissive member 60 can include a wavelength conversion material. The wavelength conversion material is, for example, a phosphor. For example, when the light-emitting element 20 emits blue light, and the phosphor contained in the light-transmissive member absorbs the light from the light-emitting element 20 and emits yellow light, white light is extracted from the light-emitting device 100C.

The light-transmissive member 60 includes a lower surface facing the upper surface 20b of the light-emitting element 20, an upper surface positioned at a side opposite the lower surface, and a side surface positioned between the lower surface and the upper surface. In the example illustrated in FIG. 7, the width of the lower surface of the light-transmissive member 60 is wider than the width of the upper surface 20b of the light-emitting element 20. The width of the lower surface of the light-transmissive member is not limited thereto, and may be the same as or smaller than the width of the upper surface of the light-emitting element 20.

In the example illustrated in FIG. 7, the shape of the light-transmissive member 60 in a cross-sectional view is rectangular. However, the shape is not limited thereto, and may be a convex shape.

The light-transmissive member 60 may be directly bonded to the light-emitting element or may be bonded through an adhesive to the light-emitting element 20.

Modified Example (2) of Second Embodiment

Figure 8:
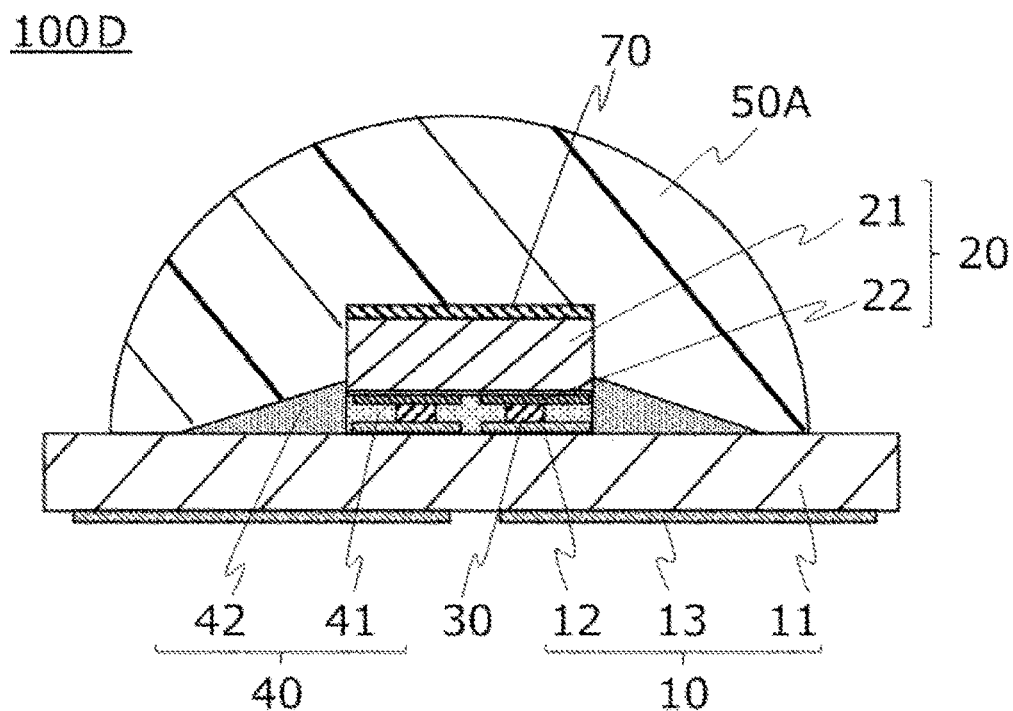
FIG. 8 is a schematic cross-sectional view illustrating a modified example (2) of the light-emitting device according to the second embodiment.

FIG. 8 is a schematic cross-sectional view illustrating a modified example (2) of the second embodiment. As illustrated in the example of FIG. 8, the light-emitting device may be a light-emitting device 100D in which a light-reflecting film 70 is arranged on the upper surface 20b of the light-emitting element 20.

The first portion 41 of the resin member 40 is in a liquid state, and therefore the light-emitting device 100D can achieve the same effect as the light-emitting device 100A. Furthermore, even when the resin member 40 thermally expands, pushing up of the light-emitting element 20 by the first portion 41 of the resin member 40 can be reduced, and therefore deformation of the sealing member 50A can be reduced. As a result, desired light distribution characteristics can be provided with the light-emitting device 100D.

With the light-emitting device 100D, light emitted from the upper surface of the light-emitting element 20 is reflected by the light-reflecting film 70, the amount of light immediately above the light-emitting element 20 is suppressed, and a batwing light distribution can be provided.

The light-reflecting film 70 may include any of a metal film of silver, copper, or the like, a dielectric multilayer film (DBR), a white resin, a combination thereof, or the like. The light-reflecting film 70 preferably has reflectance angle dependence on the incident angle with respect to the emission wavelength of the light-emitting element 20. Specifically, the reflectance of the light-reflecting film 70 is preferably set to be lower in the oblique incident than in the vertical incident. Through such a configuration, the change in brightness immediately above the light-emitting element 20 becomes gradual, and the matter of the area immediately above the light-emitting element 20 becoming extremely dark, such as becoming a dark spot, can be reduced.

Modified Example (3) of Second Embodiment

Figure 9:
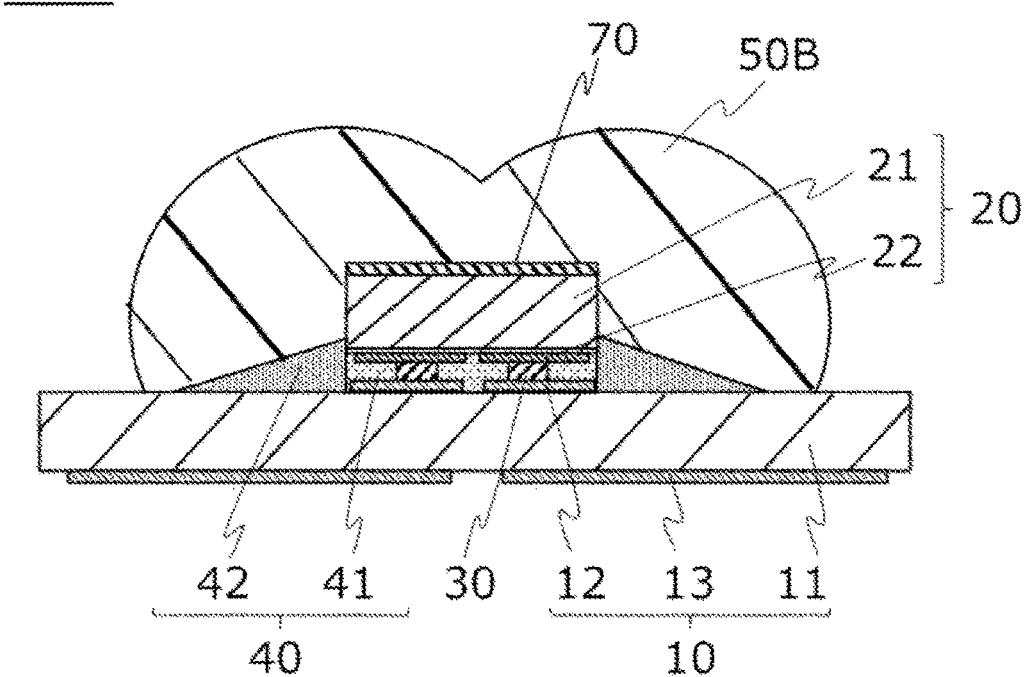
FIG. 9 is a schematic cross-sectional view illustrating a modified example (3) of the light-emitting device according to the second embodiment.

FIG. 9 is a schematic cross-sectional view illustrating a modified example (3) of the second embodiment. As illustrated in the example of FIG. 9, the light-emitting device may be a light-emitting device 100E having a sealing member 50B whose cross-sectional shape can provide a batwing light distribution.

The first portion 41 of the resin member 40 is in a liquid state, and therefore the light-emitting device 100E can achieve the same effect as the light-emitting device 100A. Furthermore, even when the resin member 40 thermally expands, pushing up of the light-emitting element 20 by the first portion 41 of the resin member 40 can be reduced, and therefore deformation of the sealing member 50B can be reduced. As a result, desired light distribution characteristics can be provided with the light-emitting device 100E.

The sealing member 50B has a shape having an indentation near the center of the upper surface of the light-emitting element 20. The sealing member 50B can be formed, for example, by a dripping method.

Third Embodiment

Figure 10:
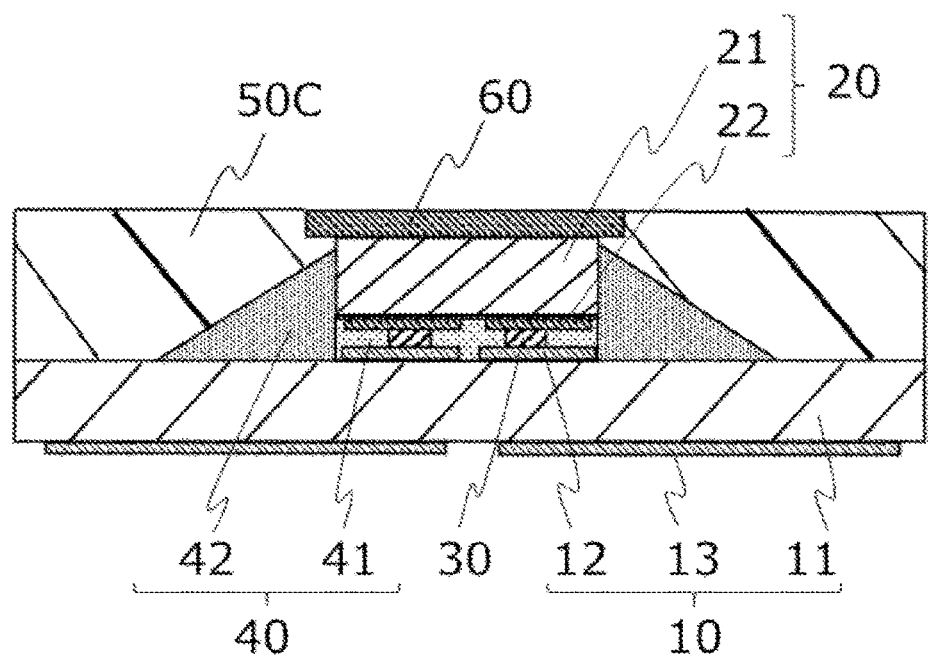
FIG. 10 is a schematic cross-sectional view illustrating a light-emitting device according to a third embodiment.

FIG. 10 is a schematic cross-sectional view illustrating a third embodiment. As illustrated in the example of FIG. 10, the light-emitting device may be a light-emitting device 100F in which the light-transmissive member 60 is arranged on the upper surface of the light-emitting element 20 and a light-reflecting sealing member 50C is arranged on the upper surface of the second portion 42 of the resin member 40. The sealing member 50C of the light-emitting device according to the third embodiment is light-reflective, and thereby the light-emitting device of the third embodiment differs from the light-emitting devices 100A to 100E according to the second embodiment. The first portion 41 of the resin member 40 is in a liquid state, and therefore the light-emitting device 100F can achieve the same effect as the light-emitting device 100A. Furthermore, even when the resin member 40 thermally expands, pushing up of the light-emitting element 20 by the first portion 41 of the resin member 40 can be reduced, and therefore detachment of the light-transmissive member 60 from the sealing member can be reduced. As a result, the state in which the sealing member 50C is in contact with the light-transmissive member 60 can be maintained, and therefore, a light-emitting device 100F having favorable "boundaries" with high contrast between the light-transmissive member 60 (light-emitting region) and the sealing member 50C (non-light-emitting region) can be produced.

The sealing member 50C includes, for example, a silicone resin and a light-reflective material. In the example illustrated in FIG. 10, the sealing member 50C is arranged on the upper surface of the second portion 42 of the resin member 40, on the side surfaces 20c of the light-emitting element 20, and on the side surfaces of the light-transmissive member 60. The upper surface of the light-transmissive member 60 is exposed from the sealing member 50C. The upper surface of the sealing member 50C is flat in the example of FIG. 10. However, the upper surface of the sealing member 50C is not limited thereto, and may be inclined such that the height decreases from the center of the light-emitting device toward the outer side.

Further, an anti-reflection film may be arranged on the upper surface of the light-transmissive member 60. As the material of the anti-reflection film, $SiO_2$ can be used, for example.

What is claimed is:

1. A method for manufacturing a light-emitting device, the method comprising:
    providing
        a light-emitting element having element electrodes including a positive element electrode and a negative element electrode on a lower surface side of the light-emitting element,
        a wiring substrate having wiring layers, and
        conductive members each electrically connecting one of the element electrodes and a corresponding one of the wiring layers,
            with at least one member of the element electrodes, the wiring layers, or the conductive members containing Au;
    arranging, between a lower surface of the light-emitting element and the wiring substrate, a resin composition in a liquid state comprising
        (component A) a siloxane compound having at least two alkenyl groups in one molecule,
        (component B) a siloxane compound having a SiH group at both terminals in one molecule and having no SiH group in a side chain, and
        (component C) a hydrosilylation reaction catalyst;
    oxidizing the component B in the resin composition in contact with the at least one member containing Au of the element electrodes, the wiring layers, or the conductive members to form a first portion of a resin member; and
    after the oxidizing of the component B, heating and curing the resin composition not in contact with the at least one member containing Au of the element electrodes, the wiring layers, or the conductive members to form a second portion of the resin member.

2. The method for manufacturing a light-emitting device according to claim 1, wherein in the arranging of the resin composition, the resin composition is arranged at a temperature in a range of 10° C. to 30° C.

3. The method for manufacturing a light-emitting device according to claim 1, wherein in the oxidizing of the component B, a temperature is maintained in a range of to 30° C. for a predetermined amount of time.

4. The method for manufacturing a light-emitting device according to claim 1, further comprising, after the oxidizing of the component B, arranging a sealing member on an upper surface of the second portion of the resin member.

5. A light-emitting device comprising:
    a wiring substrate including a base material and wiring layers;
    a light-emitting element arranged on the wiring substrate and having element electrodes including a positive element electrode and a negative element electrode on a lower surface side of the light-emitting element;
    conductive members each electrically connecting one of the wiring layers and a corresponding one of the element electrodes; and
    a resin member having
        a first portion in contact with the wiring layers, the conductive members, and the element electrodes, the first portion being in a liquid state, and
        a second portion surrounding the first portion, the second portion being in a cured state.

6. The light-emitting device according to claim 5, wherein at least one member of the wiring layers, the conductive members, or the element electrodes contains Au.

7. The light-emitting device according to claim 5, wherein the wiring layers, the element electrodes, and the conductive members contain Au.

8. The light-emitting device according to claim 5, wherein the first portion contains a siloxane compound having no SiH group, and
    the second portion contains a siloxane compound having a silethylene structure.

9. The light-emitting device according to claim 8, wherein the first portion comprises a siloxane compound having, in one molecule, a SiOH group at both terminals and a methyl group or a phenyl group in a side chain.

10. The light-emitting device according to claim 5, wherein
the light-emitting element has
a lower surface,
an upper surface, and
a side surface positioned between the lower surface and the upper surface, and
the second portion is in contact with the side surface of the light-emitting element.

11. The light-emitting device according to claim 10, wherein an upper end of the second portion is located at a position that is the same as that of the upper surface of the light-emitting element or lower than that of the upper surface of the light-emitting element.

12. The light-emitting device according to claim 5, further comprising a sealing member covering an upper surface of the second portion.

\* \* \* \* \*